United States Patent
Petruzzello et al.

(10) Patent No.: US 6,794,719 B2
(45) Date of Patent: Sep. 21, 2004

(54) HV-SOI LDMOS DEVICE WITH INTEGRATED DIODE TO IMPROVE RELIABILITY AND AVALANCHE RUGGEDNESS

(75) Inventors: John Petruzzello, Carmel, NY (US); Theodore James Letavic, Putnam Valley, NY (US); Mark Simpson, White Plains, NY (US)

(73) Assignee: Koninklijke Philips Electronics N.V., Eindhoven (NL)

(\*) Notice: Subject to any disclaimer, the term of this patent is extended or adjusted under 35 U.S.C. 154(b) by 0 days.

(21) Appl. No.: 09/894,083

(22) Filed: Jun. 28, 2001

(65) Prior Publication Data

US 2003/0001209 A1 Jan. 2, 2003

(51) Int. Cl.⁷ .............................................. H01L 21/84
(52) U.S. Cl. ..................... 257/350; 257/347; 257/335; 257/409; 257/647
(58) Field of Search .................................. 257/350, 409, 257/347, 335, 647, 404, 345

(56) References Cited

U.S. PATENT DOCUMENTS

| | | | | |
|---|---|---|---|---|
| 4,058,822 A | * | 11/1977 | Awane et al. ................... | 357/23 |
| 4,270,137 A | * | 5/1981 | Coe .............................. | 357/53 |
| 4,290,078 A | * | 9/1981 | Romen ......................... | 357/41 |
| 4,725,915 A | * | 2/1988 | Jwahashi et al. .............. | 361/91 |
| 4,766,474 A | * | 8/1988 | Nakagawa et al. ......... | 357/23.8 |
| 4,928,157 A | * | 5/1990 | Matsunaga et al. ...... | 357/23.13 |
| 5,468,984 A | | 11/1995 | Efland et al. ................. | 257/356 |
| 5,612,564 A | * | 3/1997 | Fujishima et al. ........... | 257/341 |
| 5,614,752 A | * | 3/1997 | Takenaka ..................... | 257/408 |
| 5,767,550 A | * | 6/1998 | Calafut et al. .............. | 257/355 |
| 5,812,006 A | * | 9/1998 | Teggatz et al. .............. | 327/309 |
| 5,834,823 A | * | 11/1998 | Honda ......................... | 257/488 |
| 5,907,181 A | * | 5/1999 | Han et al. ..................... | 257/630 |
| 5,912,495 A | * | 6/1999 | Depetro et al. .............. | 257/355 |
| 5,969,387 A | * | 10/1999 | Letavic et al. ............... | 257/347 |
| 5,990,516 A | * | 11/1999 | Momose et al. ............. | 257/327 |
| 6,133,591 A | * | 10/2000 | Letavic et al. ............... | 257/139 |
| 6,160,290 A | * | 12/2000 | Pendharkar et al. ......... | 257/339 |
| 6,348,716 B1 | * | 2/2002 | Yun ............................. | 257/356 |
| 6,365,932 B1 | * | 4/2002 | Kouno et al. ................ | 357/341 |
| 6,384,453 B1 | * | 5/2002 | Yanagigawa ................. | 257/355 |
| 6,414,831 B1 | * | 7/2002 | Orchard-Webb ............. | 361/111 |
| 2002/0167088 A1 | * | 11/2002 | Hoshino et al. ............. | 257/758 |

FOREIGN PATENT DOCUMENTS

| | | | |
|---|---|---|---|
| DE | 3122352 | * | 1/1983 |
| FR | 2754406 | * | 4/1998 |
| FR | 2754406 A1 | | 4/1998 |
| JP | 51-147972 | * | 12/1976 |
| JP | 2000-114266 | * | 4/2000 |
| JP | 2000-260883 | * | 9/2000 |

OTHER PUBLICATIONS

"Impact Ionization in Saturated in Saturated High–Voltage LDD Lateral DMOS Fets", by Michael E. Cornell et al., XP–002253260, pp. 164–167.
US 010045, U.S. Ser. No. 09/794,562.

* cited by examiner

*Primary Examiner*—Nathan J. Flynn
*Assistant Examiner*—Ahmed N. Sefer
(74) *Attorney, Agent, or Firm*—Aaron Waxler

(57) ABSTRACT

A hybrid semiconductor device is presented in which one or more diode regions are integrated into a transistor region. In a preferred embodiment the transistor region is a continuous (self-terminating) SOI LDMOS device in which are integrated one or more diode portions. Within the diode portions, since there is only one PN junction, the mechanism for breakdown failure due to bipolar turn-on is nonexistent. The diode regions are formed such that they have a lower breakdown voltage than the transistor region, and thus any transient voltage (or current) induced breakdown is necessarily contained in the diode regions. In a preferred embodiment, the breakdown voltage of the diode portions is lowered by narrowing their field plate length relative to the transistor portion of the device. This allows the device to survive any such breakdown without being destroyed, resulting in a more rugged and more reliable device.

5 Claims, 4 Drawing Sheets

US 6,794,719 B2

HV-SOI LDMOS DEVICE WITH INTEGRATED DIODE TO IMPROVE RELIABILITY AND AVALANCHE RUGGEDNESS

FIELD OF THE INVENTION

The present invention relates to the field of semiconductor devices, and more particularly to silicon-on-insulator lateral drift metal oxide semiconductor (SOI-LDMOS) devices suitable for high-voltage applications.

BACKGROUND OF THE INVENTION

The present invention relates generally to, and has features in common with, an invention disclosed in U.S. patent application Ser. No. 09/794,562, filed Feb. 27, 2001 by the same applicants (the "'562 Application"), which prior-filed application is incorporated herein by reference as if fully set forth. The '562 Application dealt generally with SOI LDMOS devices exemplary of the devices discussed herein.

In known MOSFET devices, a conductive path is established between two regions of the same conductivity type, i.e. the source and drain, through a body region of the opposite conductivity type. The current flows in such channel region, or in LDMOS devices, through such body region and a "lateral drift" region, in response to an applied gate voltage which creates an inversion channel in the body region, and a drain to source voltage which regulates the current which flows therein. In normal MOSFET operation, both the drain and the source regions are reverse biased vis-à-vis the body region. Due to this reverse biasing, no current flows between the drain and source except in the channel region. Thus, current can only flow from drain to source, and electrons thus flow from source to drain, as controlled by the voltage on the gate and the drain to source voltage.

If during device operation the reverse bias between the source and body regions changes to forward bias, a significant current can develop where the source region injects electrons into the body region and back to the drain region. Since this current is not directly controlled by the gate voltage or any other mechanism, it is in effect a runaway current, and can destroy the device. Such breakdown is generally referred to as "bipolar second breakdown."

For example, in a lighting application, a typical drain to source voltage is 400 V; if a surge in such drain to source voltage reaches 500 V or more, the semiconductor device may breakdown due to such bipolar turn-on, when a significant current develops between the source and drain regions, and ultimately the device will be destroyed.

Therefore, it is an object of the present invention to provide an improved semiconductor device in which it is possible to control and contain any electrical breakdown such as to obviate destruction of the device.

It is a further object of the present invention to provide an improved semiconductor device which is highly resistant to bipolar second breakdown.

These and other objects will become more apparent from the description of the invention to follow.

SUMMARY OF THE INVENTION

The present invention achieves the foregoing objects by providing a hybrid semiconductor device in which one or more diode regions are integrated into a transistor region. In a preferred embodiment the transistor region is a continuous (self-terminating) device in which are integrated one or more diode portions. Within the diode portions, since there is only one PN junction, the mechanism for breakdown failure due to bipolar turn-on is nonexistent. The diode regions are formed such that they have a lower breakdown voltage than the transistor region, and thus any transient voltage (or current) induced breakdown is necessarily contained in the diode regions. In a preferred embodiment, the breakdown voltage of the diode portions is lowered by narrowing their field plate length relative to the transistor portion of the device. This allows the device to survive any such breakdown without being destroyed, resulting in a more rugged and more reliable SOI LDMOS device.

DETAILED DESCRIPTION OF THE INVENTION

The motivation of the present invention is a simple idea. Given that power transistors can be seriously damaged by bipolar second breakdown, such breakdowns need to be prevented, and any overvoltage breakdowns contained and controlled. Since avalanche breakdown in diodes cannot lead to bipolar second breakdown, a diode structure is integrated within a transistor device, and engineered so as to have a lower breakdown voltage than the transistor. Thus, any breakdown is contained only to the diode device, rendering the overall transistor more rugged and robust. The diode regions serve as a kind of shock absorber or lightning rod for a transient current or voltage spike and the avalanche breakdown that may result therefrom. They absorb the overvoltage and survive it, leaving the transistor unscathed. The transistor structure can be easily modified to form the diode structure, by simply deleting the source region of the transistor structure. Thus, merely a simple modification to the fabrication of the transistor structure is needed to create the integrated device.

Figure 1:
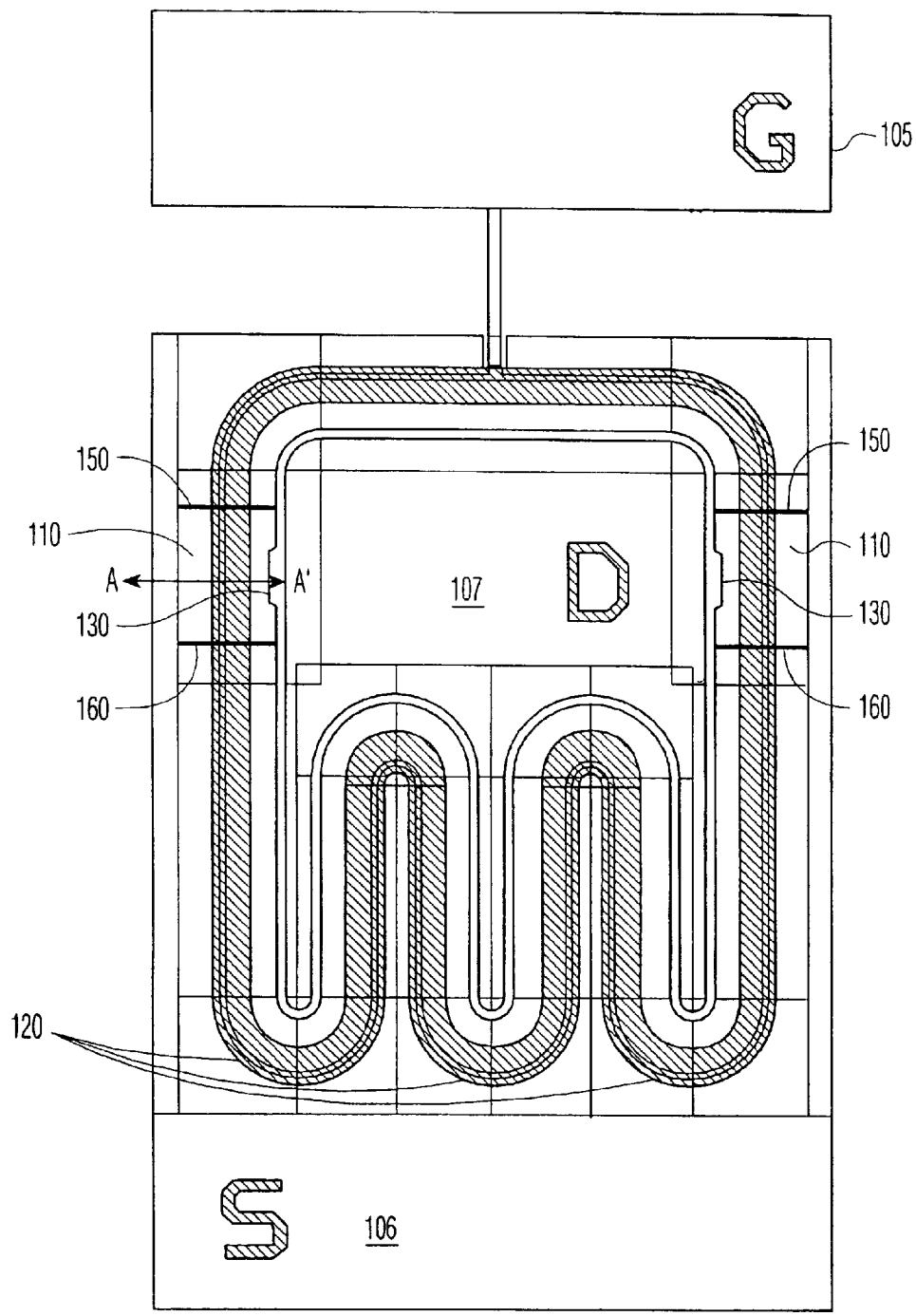
FIG. 1 is a schematic top plan view of a high voltage SOI MOSFET hybrid device according to the invention.

In accordance with the objects of the invention, FIG. 1 illustrates a high voltage silicon-on-insulator (SOI) hybrid semiconductor device 10 in top plan view. The device is self terminating—i.e., the width is a continuous connected path, with "fingers" 120 at the bottom of the figure for achieving larger device width within a smaller area. It is noted that if greater device width is desired fingers could be added at the top and sides of the shown structure as well, the depicted structure being solely an exemplary one of numerous possible embodiments. As will be clearer from a comparison of FIGS. 1 and 2, the latter figure being a cross section along the arrow A–A' in FIG. 1, the source 106 comprises the exterior of the device, the drain 107 comprises the interior, and the gate 105 lies in between the source and drain, and is electrically connected to a field plate which extends drainward, or towards the interior of the device, for most of the length of the device, which is the direction perpendicular to the continuous path at any point along the depicted path. Where the gap appears in FIG. 1 between the drain region 107 on the interior and the source region on the exterior of the device is the area between the drainward edge of the field plate and the drain 107. The gate 105 is located in the middle of the source 106 and drain 107 regions. The diode portions 110 of the integrated device (the left side diode region in FIG. 1 shown in cross section in FIG. 2) are here depicted as two regions, but more or less could be fashioned as desired by the user. The diode regions are delineated from the remainder of the transistor by upper lines 150 and lower lines 160 in FIG. 1.

Figure 2:
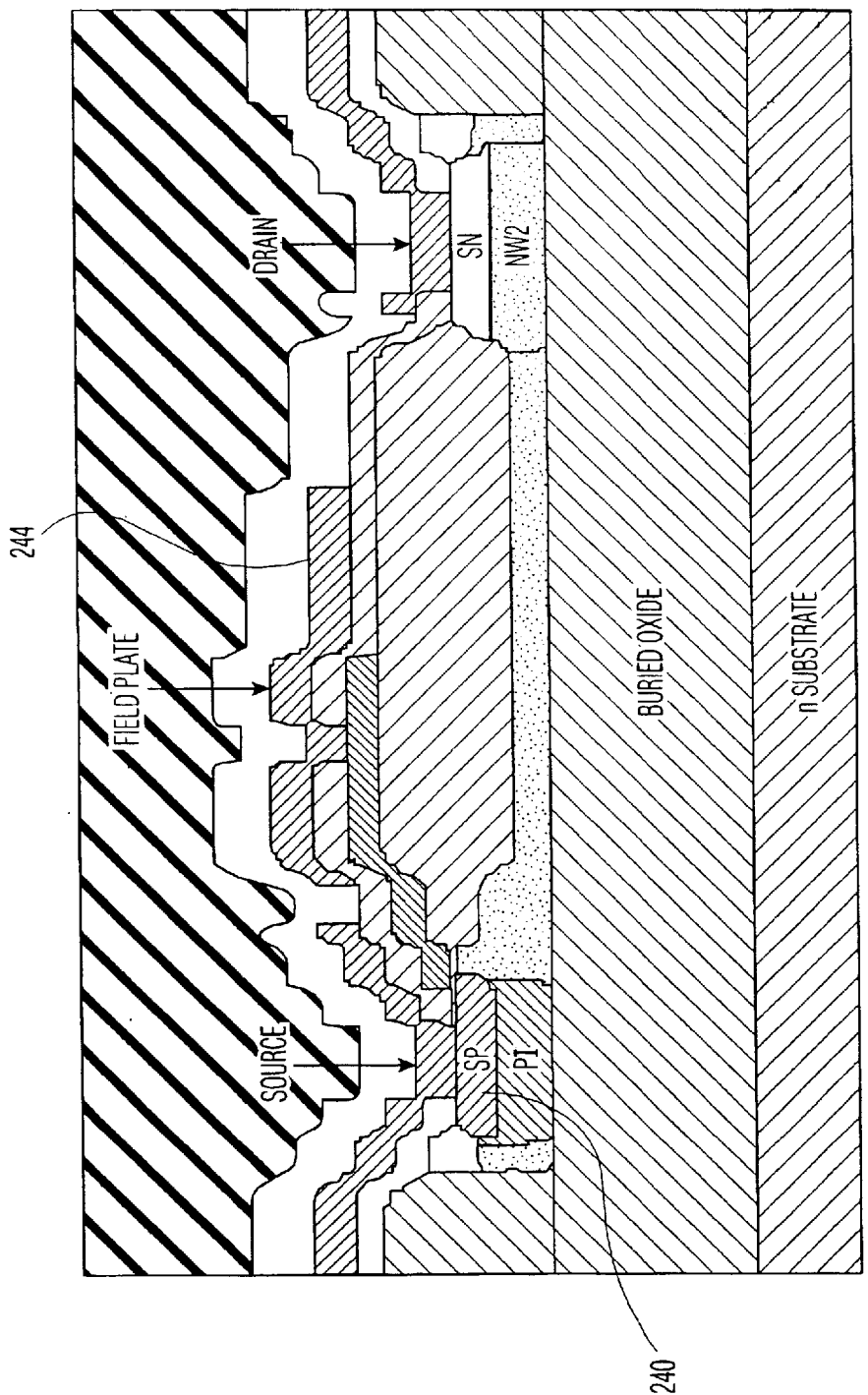
FIG. 2 is a cross sectional view of the hybrid device taken along line A–A' of FIG. 1 to portray its diode portion.
Figure 3:
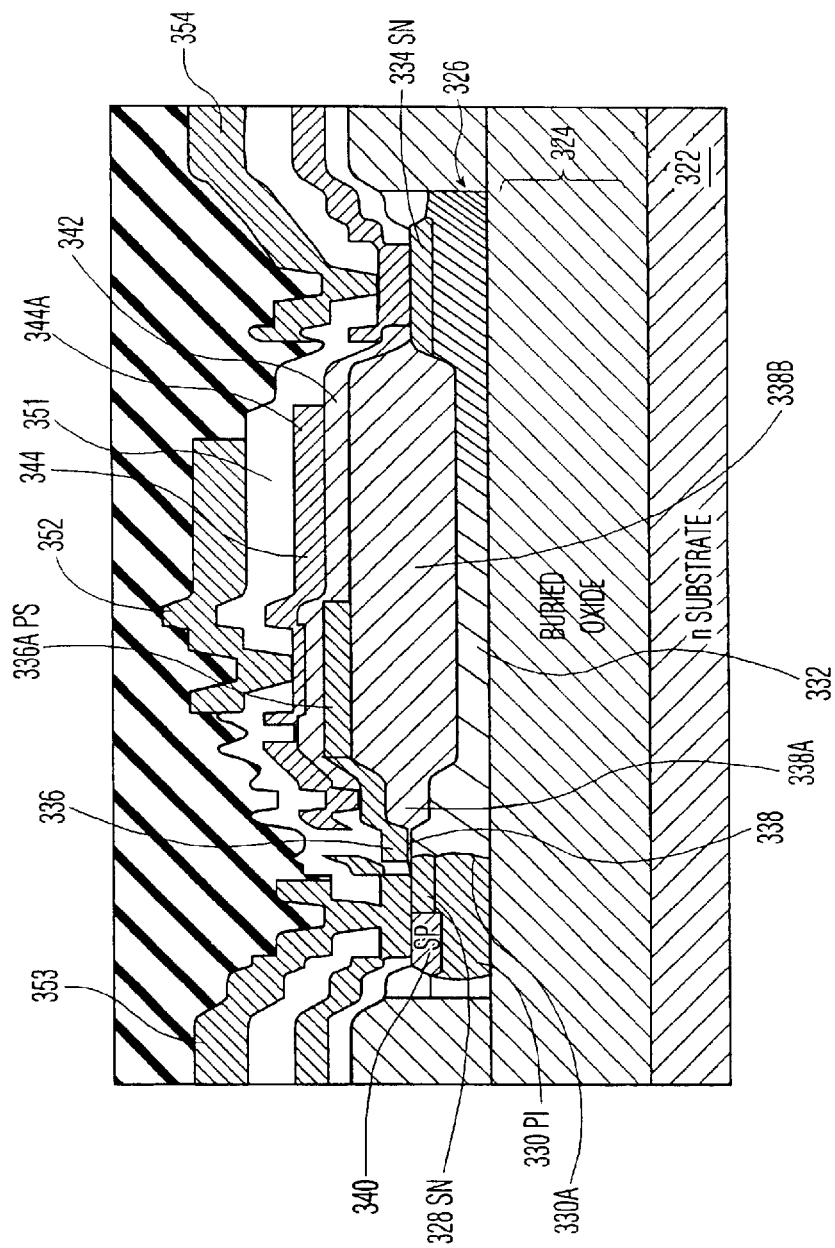
FIG. 3 depicts a cross section of an exemplary SOI LDMOS structure such as may be used for the transistor portion.

Inasmuch as FIGS. 2 and 3 depict very similar structures, and the structure of FIG. 2 is derived from that of FIG. 3 with a deletion, FIG. 3 will next be described.

In the simplified cross-sectional view of FIG. 3, a lateral thin film SOI LDMOS transistor includes a semiconductor substrate 322, a buried insulating layer 324, and a semiconductor surface layer 326 in which the device is fabricated. The MOS transistor includes a source region 328 of one conductivity type (here shown, for example, as n-type), a body region 330 of a second, opposite conductivity type (here, for example, as p-type), a lateral drift region 332 of the first conductivity type and a drain region 334, also of the first conductivity type. The edge of the body region adjoining the drift region is denoted by reference number 330A. The basic device structure is completed by a gate electrode 336, insulated from the semiconductor surface layer 326 by an oxide insulation region 338. Within the scope of the invention, the MOS transistor structure used in the present invention will preferably have various performance enhancing features such as a stepped oxide region 338A and 338B, an extended gate electrode structure forming a field portion 336A, an insulating oxide layer 342 covering the gate electrode 336 and extended gate electrode 336A, a top field plate 344 made of a metal or equivalently conductive material, an extended portion of the top field plate 344A protruding laterally towards the drain side of the device, as well as numerous and various other performance enhancing features as may be desired, without departing from the spirit or scope of the invention. As well, the depicted MOS transistor includes a surface contact region 340, in contact with the source region 328, located in the body region 330 and being of the same conductivity type as the body region but more highly doped. It is noted that for use with high voltage applications, where the drain to source voltage is on the order of hundreds of volts, the conducting top field plate is a necessity in order to hold the voltage. The voltage that can be held is proportional to the length of the field plate.

FIG. 3 additionally shows a metal top field plate 344 connected to the extended polysilicon gate electrode structure 336A, an extension of the top field plate 344A, an insulating layer 351 above the top field plate 344, and extended top field plate 344A, and the three metal contacts to the gate 336, source 328, and drain 334 of the device, being items 352, 353 and 354, respectively.

Additionally, the increase in shading from light to dark of the lateral drift region 332 from the left to the right of the figure, i.e., from the source side to the drain side of the drift region, indicates an increasing doping profile with drainward proximity as is known in the art. Such increased doping may be linear, or some other profile as may be useful in given circumstances and uses, as is known, or may be known, in the art.

FIG. 2 depicts the derived diode device, and is identical in structure to FIG. 3 except for the absence of the source region on the left side of the figure. All that remains in its stead, with reference to FIG. 2, is the surface contact region 240. Another exception, as shall be described, is the length of the field plate 244, which does not extend as far drainward, or to the right, in the diode structure of FIG. 2 as it does in the transistor structure of FIG. 3.

It is understood that the simplified representative devices shown in the Figures herein depict particular device structures, but that wide variations in both device geometry and configuration can be used within the scope of the invention.

As described above, the diode regions serve as a kind of lightning rod or shock absorber of any overvoltage breakdown. By creating one or more diode portions within the overall semiconductor device, if an overvoltage breakdown occurs, it will occur in diode regions. The current flow will be held to a level such that a breakdown will not mean a device failure. It is noted, however, that if the voltage is high enough even a diode can fail. This would occur as the result of an avalanche breakdown, where the current reaches high enough levels for the temperature to rise significantly, and the metal in the device melts. This is generally a rare occurrence, however. In any event, a diode avalanche can never lead to a bipolar second breakdown, as described above.

On the other hand, in the transistor region, if a bipolar second breakdown occurs this could well destroy the device. The reason is as follows. Referring to FIG. 3, if the current is large enough—due, for example, to a voltage spike on the drain—numerous holes in the body region 330 will travel underneath the source region 328 towards the surface 340 contact, and forward bias the PN junction between the body region 330 and the source 328. This will turn on the NPN transistor comprising the drift region (N) 332, the body region (P) 330, and the source region (N) 328. This results in the source 328 injecting electrons into the body region 330 and out to the drain 334, at the operating gain of such NPN transistor. This current is thus uncontrolled (as the "base" current from the body region into the source is uncontrolled) and thus the flow of electrons from "emitter to collector", i.e., from the source 328 to the drain 334 results in an avalanche and destroys the device. Removing the source leaves only one PN junction, and obviates the NPN gain, and thus the bipolar second breakdown, from ever occurring, and the resulting diode region can handle the avalanche through it, provided the breakdown is controlled to occur only in the diode regions.

Figure 4:
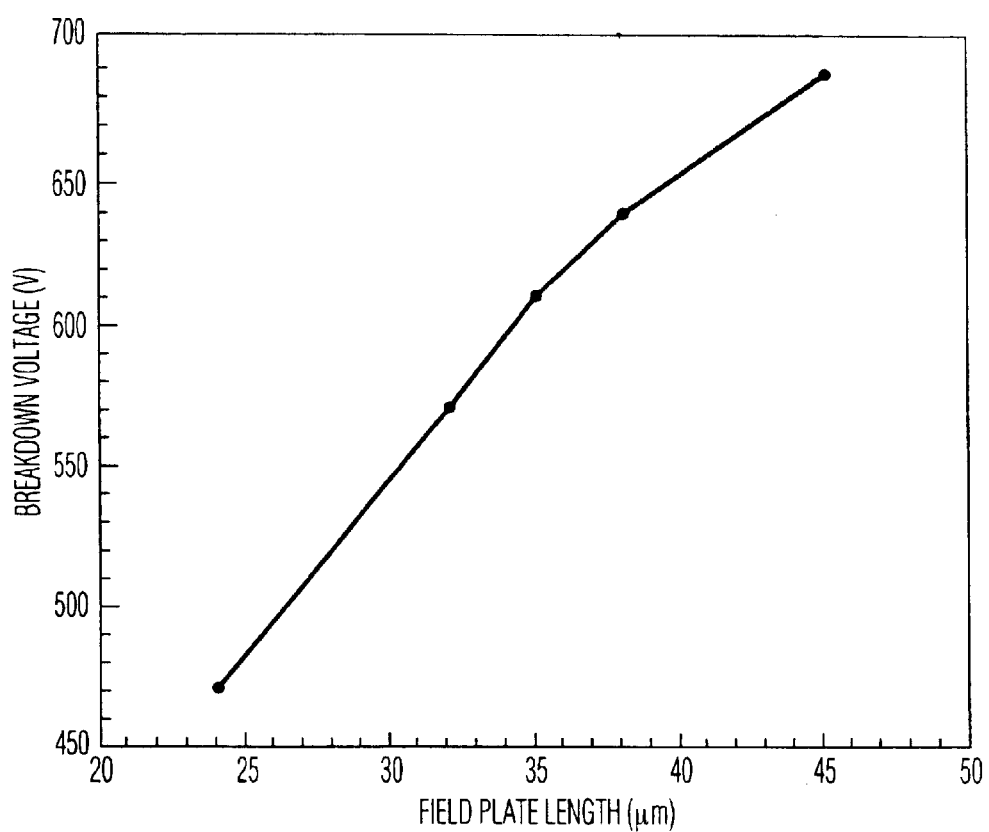
FIG. 4 is a plot of breakdown voltage as a function of the field plate length.

To insure that the breakdown occurs in the diode regions, the diode field plate 244, with respect to FIG. 2, has a shorter length. A shorter field plate implies a lower breakdown voltage, as seen in graphical form in FIG. 4. As shown, with a field plate length L of approximately 45 µm, a breakdown will occur at approximately 675 volts, whereas at a field plate length L of approximately 24 µm, breakdown will occur at 470 volts. In other words, the product designer can, with the aid of the invention, predetermine the level of breakdown voltage, providing a predictable degree of protection.

While the present invention is described with respect to specific embodiments thereof, it is recognized that various modifications and variations thereof may be made without departing from the scope and spirit of the invention, which is more clearly understood by reference to the claims appended hereto.

What is claimed is:

1. A hybrid semiconductor device, comprising:
   a first portion being relatively resistant to breakdown voltage, the first portion comprising a MOS transistor having a first field plate; and
   a second portion being less resistant to breakdown voltage and able to survive breakdown without device failure, the second portion residing adjacent the first portion and comprising a diode having a second field plate, wherein the diode has a substantially identical structure as the MOS transistor, except for a source region;

where breakdown occurs at a higher voltage in the first portion, and at a lower voltage in the second position;

and where the breakdown voltage difference is due to a difference in field plate length between said first field plate and said second field plate.

2. The device of claim 1, where the transistor is an SOI-LDMOS device.

3. The device of claim 1, where the transistor is any of an NMOS or PMOS device.

4. A hybrid lateral thin-film Silicon-on-Insulator device comprising:

a first region comprising:

a semiconductor substrate, a buried insulating layer on said substrate, and a lateral MOS device in an SOI layer on said buried insulating layer and having a source region of a first conductivity type formed in a body region of a second conductivity type opposite to that of the first, a lateral drift region of said first conductivity type adjacent to said body region, a drain region of said first conductivity type and laterally spaced apart from said body region by said lateral drift region, a gate electrode over a part of said body region and over a first part of said lateral drift region adjacent to said body region, said gate electrode being insulated from said body region and drift region by a first insulation region, with a field plate comprised of conducting material extending laterally over said lateral drift region and being electrically connected to said gate electrode; and one or more second regions integrated with the first region, said second regions being identical to the first region, except not comprising said source region, and having a field plate of shorter length than that of the first region.

5. The device of claim 4, where the width of each of the second regions is at least as long as the lateral drift region.

* * * * *